United States Patent
Bellur et al.

(10) Patent No.: US 9,093,995 B2
(45) Date of Patent: Jul. 28, 2015

(54) LENGTH-OF-DIFFUSION PROTECTED CIRCUIT AND METHOD OF DESIGN

(71) Applicant: QUALCOMM Incorporated, San Diego, CA (US)

(72) Inventors: Kashyap Ramachandra Bellur, San Diego, CA (US); HariKrishna Chintarlapalli Reddy, Bangalore (IN); Martin Saint-Laurent, Austin, TX (US); Pratyush Kamal, San Diego, CA (US); Prayag Bhanubhai Patel, San Diego, CA (US); Esin Terzioglu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/905,052

(22) Filed: May 29, 2013

(65) Prior Publication Data
US 2014/0354338 A1    Dec. 4, 2014

(51) Int. Cl.
*H03K 3/012* (2006.01)
*H03K 3/037* (2006.01)
*G06F 17/50* (2006.01)
*H03K 3/356* (2006.01)

(52) U.S. Cl.
CPC ............ *H03K 3/037* (2013.01); *G06F 17/5068* (2013.01); *G06F 17/5081* (2013.01); *H03K 3/012* (2013.01); *H03K 3/356* (2013.01)

(58) Field of Classification Search
CPC ... G06F 15/78; H03K 19/008; H03K 19/0013
USPC .......................................... 327/199, 201, 202
See application file for complete search history.

(56) References Cited

U.S. PATENT DOCUMENTS

| 7,897,479 | B2 | 3/2011 | Lin et al. |
| 7,958,465 | B2 | 6/2011 | Lu et al. |
| 2010/0259308 | A1 | 10/2010 | Wang et al. |
| 2012/0032293 | A1 | 2/2012 | Chen et al. |
| 2012/0249217 | A1* | 10/2012 | Fukuda et al. ................. 327/436 |
| 2012/0256273 | A1 | 10/2012 | Chiang et al. |

OTHER PUBLICATIONS

International Search Report and Written Opinion—PCT/US2014/039867—ISA/EPO—Nov. 26, 2014.
Moroz V., et al., "Stress-Aware Design Methodology", Quality Electronic Design, 2007. ISQED'06. 7th International Symposium on, IEEE, Piscataway, NJ, USA,IEEE, Mar. 27, 2006, pp. 1-6, XP002681767, ISBN: 978-0-7695-2523-5 the whole document.
Saint-Laurent M., et al., "A 65-nm pulsed latch with a single clocked transistor", Low Power Electronics and Design (ISLPED), 2007 ACM/IEEE International Symposium on, IEEE, Piscataway, NJ, USA, Aug. 27, 2007, pp. 347-350, XP031711262, the whole document.

* cited by examiner

*Primary Examiner* — John Poos
(74) *Attorney, Agent, or Firm* — Novak Druce Connolly Bove + Quigg LLP (57) ABSTRACT

A circuit includes a pulsed-latch circuit. The pulsed-latch circuit includes a first plurality of transistors. One or more of the first plurality of transistors is length-of-diffusion (LOD) protected.

21 Claims, 7 Drawing Sheets

LENGTH-OF-DIFFUSION PROTECTED CIRCUIT AND METHOD OF DESIGN

I. FIELD

The present disclosure is generally related to circuits and methods of designing circuits.

II. DESCRIPTION OF RELATED ART

Advances in technology have resulted in smaller and more powerful electronic devices. For example, there currently exist a variety of mobile devices, such as wireless telephones, personal digital assistants (PDAs), and paging devices. The mobile devices may be small, lightweight, and easily carried by users. Wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, wireless telephones and other electronic devices can include significant computing capabilities.

Integrated circuits increasingly include greater numbers of transistors. For example, as semiconductor processes scale down, more transistors may be fabricated in a particular semiconductor area, which may enable smaller and more powerful electronic devices. However, some circuit characteristics may not linearly "scale" with the semiconductor processes. For example, performance variations caused by differing physical characteristics between transistors may be more pronounced for a reduced size semiconductor process, particularly for circuit components designed to operate using "matched" transistors and/or precise time intervals. Such variations may alter operation associated with the electronic devices (e.g., drive current degradation) and can create significant challenges for generating a layout of a semiconductor device (e.g., generating a layout that complies with circuit design parameters while including a high number of transistors for a particular area).

III. SUMMARY

An integrated circuit in accordance with the present disclosure may include bridged (e.g., extended) oxide-on-diffusion (OD) "islands." Because transistors formed at the edges of an OD region may exhibit different or "mismatched" performance characteristics (e.g., threshold voltage and/or drain current) as compared to transistors at the center of the OD region, bridging multiple OD regions or "islands" to form a continuous OD region may increase performance similarity between transistors. For example, shallow trench isolation (STI) edges at the ends of the OD region may mechanically stress the edge transistors more than the center transistors, potentially causing a performance mismatch in conventional devices (e.g., due to a length-of-diffusion (LOD) effect).

By bridging OD regions of an integrated circuit, increased performance similarity between transistors may be achieved, which may improve operation of the integrated circuit. To illustrate, for a pulsed-latch circuit designed to operate based on a short pulse width (e.g., approximately 200 picoseconds), a "mismatch" caused by performance differences between transistors at edge and center regions of an OD region may be avoided. Accordingly, the pulsed-latch circuit may exhibit variation control, higher drive current/better performance, higher yield, more accurate pulse width control, tighter distribution of pulse width, and/or other desirable performance characteristics.

Extending an OD region may include creating a dummy device. For example, extending the OD region may cause the OD region to connect to a poly-silicon (pSi) region, creating at least one "dummy" transistor. The dummy transistor may be gated open (e.g., source-drain shorted) and coupled to a power terminal or to a ground terminal, causing the dummy transistor to function as a "decoupling capacitor" (e.g., by shunting or "decoupling" particular frequencies of a signal to ground), which may be advantageous. According to alternative embodiments, the dummy transistor may be gated closed and may connect to other electrical nodes.

In a particular embodiment, a circuit includes a pulsed-latch circuit. The pulsed-latch circuit includes a first plurality of transistors. One or more of the first plurality of transistors is length-of-diffusion (LOD) protected.

In another particular embodiment, a method includes identifying, in a circuit design and by a processor, a gap between a first oxide-on-diffusion (OD) region and a second OD region. In response to identifying the gap, the processor bridges the gap by adding a dummy device to the circuit design to generate a modified circuit design.

In another particular embodiment, a method includes generating an output signal at a pulsed-latch circuit that includes a plurality of transistors. Each of the plurality of transistors is length-of-diffusion (LOD) protected.

In another particular embodiment, a computer-readable storage medium stores instructions executable by a processor to perform operations including identifying, in a circuit design and by the processor, a gap between a first oxide-on-diffusion (OD) region and a second OD region. The operations further include bridging the gap, in response to identifying the gap and by the processor, by adding a dummy device to the circuit design to generate a modified circuit design.

In another particular embodiment, an apparatus includes means for generating a pulse signal responsive to a clock signal. The apparatus further includes means for generating an output signal responsive to the pulse signal. The means for generating the output signal includes multiple transistors that are each length-of-diffusion (LOD) protected.

One particular advantage provided by at least one of the disclosed embodiments is increased performance similarity between transistors of an integrated circuit. For example, for a pulsed-latch circuit designed to operate based on a short pulse width (e.g., approximately 200 picoseconds), a "mismatch" caused by performance differences between transistors at edge and center regions of an OD region may be avoided. Accordingly, the pulsed-latch circuit may exhibit variation control, higher drive current/better performance, higher yield, more accurate pulse width control, tighter distribution of pulse width, and/or other desirable performance characteristics. Other aspects, advantages, and features of the present disclosure will become apparent after review of the entire application, including the following sections: Brief Description of the Drawings, Detailed Description, and the Claims.

V. DETAILED DESCRIPTION

Figure 1:
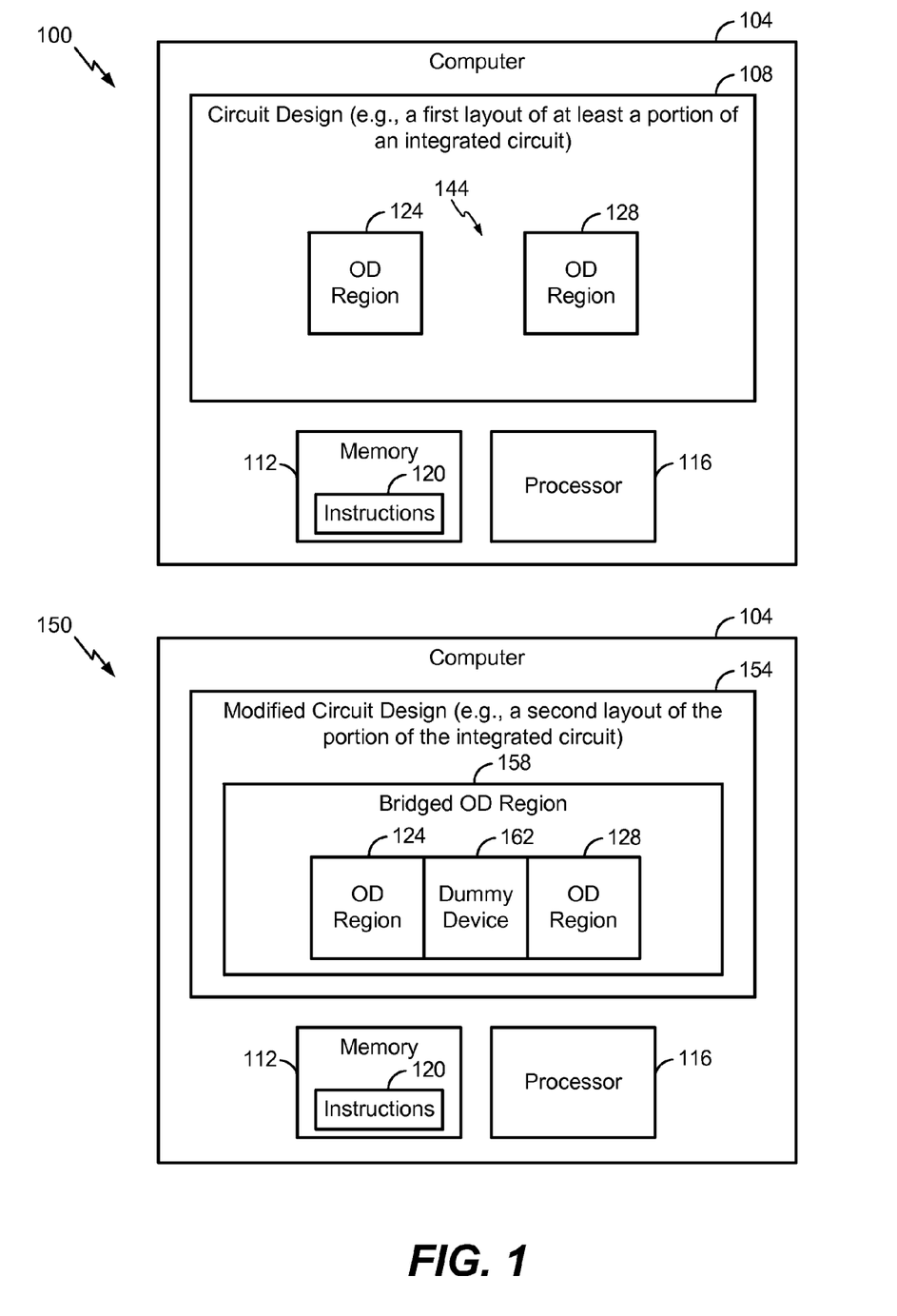
FIG. 1 is a diagram illustrating a particular embodiment of modification of a circuit design.

Referring to FIG. 1, a system to generate a circuit design 108 is depicted and generally designated 100. After modification of the circuit design 108 to generate a modified circuit design 154, the system is depicted and generally designated 150. The circuit design 108 is generated using a computer 104. As shown in FIG. 1, the computer 104 includes a processor 116 coupled to a memory 112. The memory 112 may store instructions 120 that are executable by the processor 116. In a particular embodiment, the circuit design 108 is displayed at a display device of the computer 104.

The circuit design 108 may include a first oxide-on-diffusion (OD) region 124 (e.g., a contiguous region of diffusion and transistor gate oxide) and a second OD region 128. The OD regions 124, 128 may correspond to one or more transistors of an integrated circuit to be fabricated based on the circuit design 108. For example, the circuit design 108 may correspond to a first layout of at least a portion of the integrated circuit and may be generated during a layout phase of designing the integrated circuit.

As shown in FIG. 1, a gap 144 in the circuit design 108 separates the first OD region 124 and the second OD region 128. In a particular embodiment, the instructions 120 are executable by the processor 116 to identify the gap 144 between the OD regions 124, 128. For example, the instructions 120 may be executable by the processor 116 to analyze data associated with the circuit design 108 to identify gaps between OD regions of the circuit design 108, such as the gap 144 separating the OD regions 124, 128. The instructions 120 may be executable by the processor 116 to bridge the gap 144 to generate the modified circuit design 154. The modified circuit design 154 may correspond to a second layout of at least a portion of the integrated circuit and may be generated during the layout phase of designing the integrated circuit.

In the modified circuit design 154, the gap 144 has been bridged to form a bridged (e.g., continuous) OD region 158. The bridged OD region 158 includes the first OD region 124 and the second OD region 128. The bridged OD region 158 further includes a dummy device 162 that has bridged the gap 144 (e.g., the dummy device 162 has been added to the circuit design 108 to generate the modified circuit design 154).

As explained further below, bridging the gap 144 to generate the modified circuit design 154 may improve performance of an integrated circuit that is generated based on the modified circuit design 154. For example, by removing the gap 144, performance of transistors that are on an "edge region" of one or both of the OD regions 124, 128 may be improved as compared to transistors that are not on an edge region or transistors that are at a center region of one or both of the OD regions 124, 128. For example, transistors proximate to a shallow trench isolation (STI) region (e.g., "edge" transistors) may experience more physical stress as compared to transistors that are not adjacent to the STI region (e.g., non-edge transistors), as explained further with reference to FIG. 2. Bridging the gap 144 may relieve or reduce physical stress associated with a length-of-diffusion (LOD) effect, enhancing circuit performance.

Figure 2:
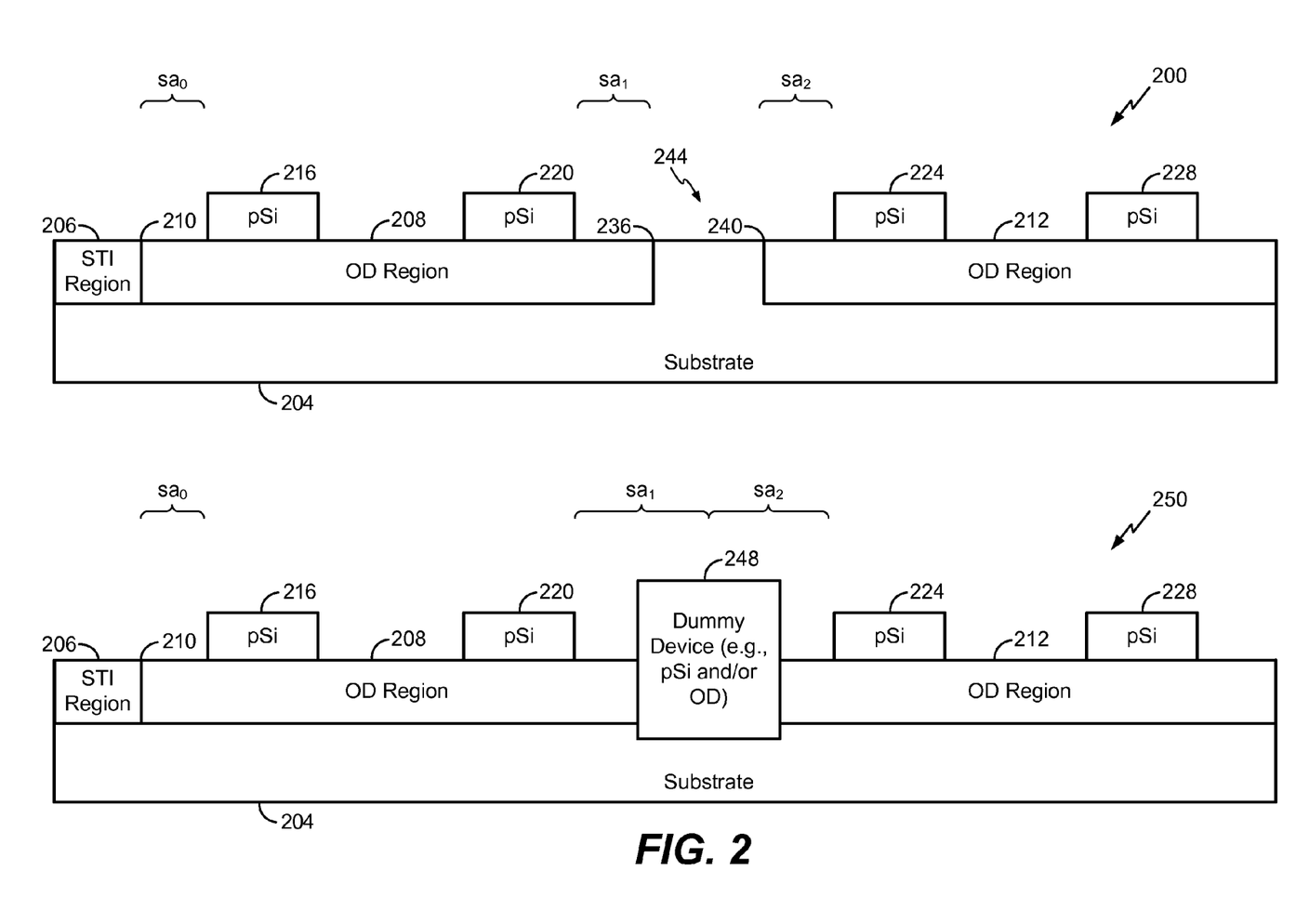
FIG. 2 is a diagram illustrating another particular embodiment of modification of a circuit design.

Referring to FIG. 2, a particular illustrative embodiment of a circuit design is depicted and generally designated 200 and a particular illustrative embodiment of a modified circuit design is depicted and generally designated 250. The circuit designs 200, 250 may correspond to the circuit designs 100, 150 of FIG. 1, respectively, and may be generated by the computer 104 of FIG. 1.

The circuit designs 200, 250 each include a substrate 204, a first OD region 208, a second OD region 212 and a plurality of poly-silicon (pSi) regions. The OD regions 208, 212 may correspond to the OD regions 124, 128 of FIG. 1. In the example of FIG. 2, the plurality of pSi regions includes a first pSi region 216, a second pSi region 220, a third pSi region 224, and a fourth pSi region 228. The circuit designs 200, 250 further include a shallow trench isolation (STI) region 206. The STI region 206 has an STI edge 210 (i.e., the STI region 206 is separated from the first OD region 208 by the STI edge 210). Alternatively, instead of the STI region 206, a field oxide region may be adjacent to the first OD region 208 (not shown in FIG. 2).

In the example of FIG. 2, the circuit design 200 includes a gap 244 separating the first OD region 208 and the second OD region 212. The gap 244 may correspond to the gap 144 of FIG. 1. As shown in FIG. 2, a first OD edge 236 and a second OD edge 240 define the gap 244. In a particular embodiment, the gap 244 corresponds to an STI region, such as an STI region that separates the OD regions 208, 212.

Each of the plurality of pSi regions 216, 220, 224, 228 may be associated with a respective length between an edge of the respective pSi region and an edge of one of the OD regions 208, 212. For example, in FIG. 2, the first pSi region 216 is associated with a length $sa_0$. The length $sa_0$ indicates a distance between the pSi region 216 and the STI edge 210. As an additional example, the pSi regions 220, 224 may be associated with respective lengths $sa_1$ and $sa_2$ that indicate distances between the pSi regions 220, 224 and the OD edges 236, 240, respectively. In a particular embodiment, the distance $sa_0$ is greater than a threshold length, such as a minimum length associated with a fabrication technology used to fabricate a transistor that includes the pSi region 216. Hence, as used herein, a transistor that includes the pSi region 216 is "LOD protected," as explained further with reference to FIG. 3. In addition, as explained further below, the gap 244 may be bridged, in the modified circuit design 250, to extend the lengths $sa_1$, $sa_2$ (e.g., to extend the lengths $sa_1$, $sa_2$ to be greater than the minimum lengths defined by the fabrication technology used to fabricate transistors that include the pSi regions 220, 224). As used herein, an "edge" is "removed" by adding a material (e.g., the dummy device 248) to connect two portions defined by the edge (e.g., to connect the OD regions 208, 212 to remove the edges 236, 240).

For example, in the modified circuit design 250, a dummy device 248 has been added between the OD regions 208, 212. The dummy device 248 may correspond to a dummy transistor. For example, the dummy device 248 may include a pSi material that corresponds to a gate of a dummy transistor. Thus, by bridging the OD regions 208, 212 with the pSi material, a dummy transistor may be formed. In addition, each of the lengths $sa_1$, $sa_2$ have been lengthened by adding the dummy device 248, since, for example, adding the dummy device 248 removes the gap 244 and therefore removes the OD edges 236, 240 from the circuit design 200 to generate the modified circuit design 250. As used herein, an "edge" may be "removed" by adding a material (e.g., the dummy device 248) to connect two portions defined by the edge (e.g., to connect the OD regions 208, 212 to remove the edges 236, 240).

By adding the dummy device 248, transistors formed using the pSi regions 220, 224 that would have been proximate to the OD edges 236, 240 are not adjacent (i.e., are non-adjacent) to an edge in the modified circuit design 250 (e.g., are instead proximate to the dummy device 248). Accordingly, because edge devices may exhibit different performance than non-edge devices, adding the dummy device 248 may improve uniformity between transistors in an integrated circuit that is fabricated based on the modified circuit design 250 relative to an integrated circuit that is fabricated based on the circuit design 200.

Figure 3:
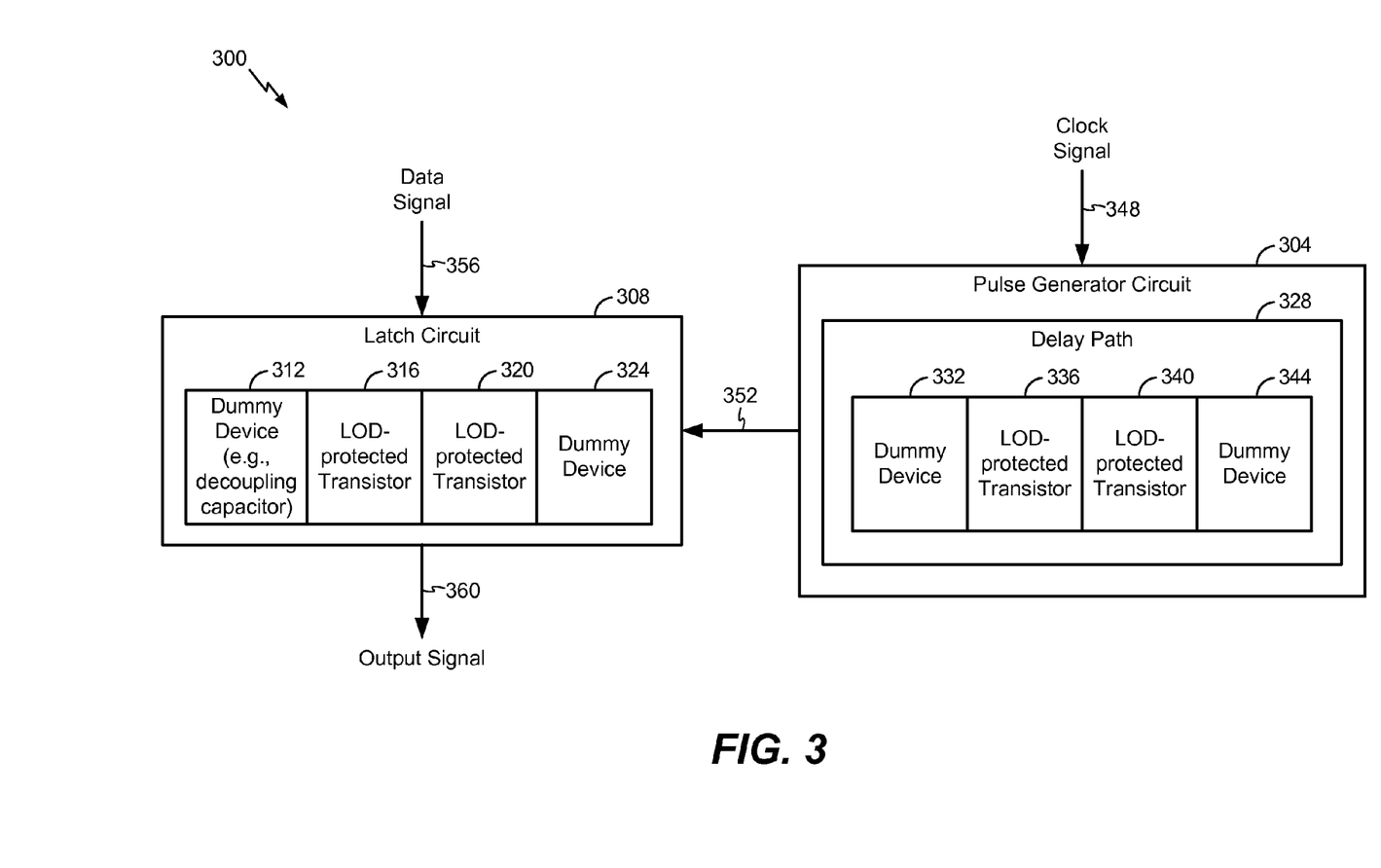
FIG. 3 is a diagram illustrating a particular embodiment of a pulsed-latched circuit.

Referring to FIG. 3, a particular illustrative embodiment of a pulsed-latched circuit is depicted and generally designated 300. As depicted in FIG. 3, the pulsed-latched circuit 300 includes a pulse generator circuit 304 and a latch circuit 308.

The latch circuit 308 includes a plurality of LOD protected transistors. For example, the latch circuit 308 includes a first LOD protected transistor 316 and a second LOD protected transistor 320. As used herein, "LOD protected" may indicate a transistor having a length sa (as described with reference to FIG. 2) that is greater than a threshold length, such as a minimum length associated with (e.g., defined by) a fabrication technology used to fabricate the transistor. The latch circuit 308 further includes one or more dummy devices, such as a first dummy device 312 and a second dummy device 324. One or more of the dummy devices 312, 324 may correspond to the dummy device 162 of FIG. 1, the dummy device 248 of FIG. 2, or a combination thereof.

The pulse generator circuit 304 may include a delay path 328 that includes one or more LOD protected transistors and one or more dummy devices. In the particular example of FIG. 3, the delay path 328 includes a third dummy device 332, a third LOD protected transistor 336, a fourth LOD protected transistor 340, and a fourth dummy device 344. One or more of the dummy devices 332, 344 may correspond to the dummy device 162 of FIG. 1, the dummy device 248 of FIG. 2, or a combination thereof. It should be appreciated that the particular number of transistors and dummy devices used in the pulsed-latch circuit 300 may depend on the particular application and may be different than that depicted in the particular example of FIG. 3.

In operation, the pulse generator circuit 304 is responsive to a clock signal 348 to generate a pulse signal 352. The latch circuit 308 is responsive to the pulse signal 352 generated by the pulse generator circuit 304 and is further responsive to a data signal 356. For example, the latch circuit 308 may sample the data signal 356 at times determined by the pulse signal 352. By sampling the data signal 356 at times determined according to the pulse signal 352, the latch circuit 308 may generate an output signal 360 (e.g., a pulse having a pulse width of approximately 200 picoseconds (ps)).

Because the pulsed-latch circuit 300 may require precise timing parameters, the pulsed-latch circuit 300 may be sensitive to process variations associated with a process used to fabricate the pulsed-latch circuit 300. For example, because an edge device may exhibit different performance as compared to a non-edge device as explained with reference to FIG. 2, by including the dummy devices 312, 324, 332, 344, performance of the pulsed-latch circuit 300 may be improved by ensuring that none of the LOD protected transistors 316, 320, 336, 340 is adjacent to an edge, such as an edge of a shallow trench isolation region (e.g., the STI edge 210 of the STI region 206 of FIG. 2). Further, by insuring that the length sa of each of the LOD protected transistors 316, 320, 336, 340 is greater than a minimum length defined by a fabrication technology used to fabricate the LOD protected transistors 316, 320, 336, 340 process variations between the LOD protected transistors 316, 320, 336, 340 may have a reduced effect on performance of the pulsed-latch circuit 300 (e.g., the LOD protected transistors may be more evenly "matched") as compared to devices where transistors are fabricated according to the minimum length.

Figure 4A:
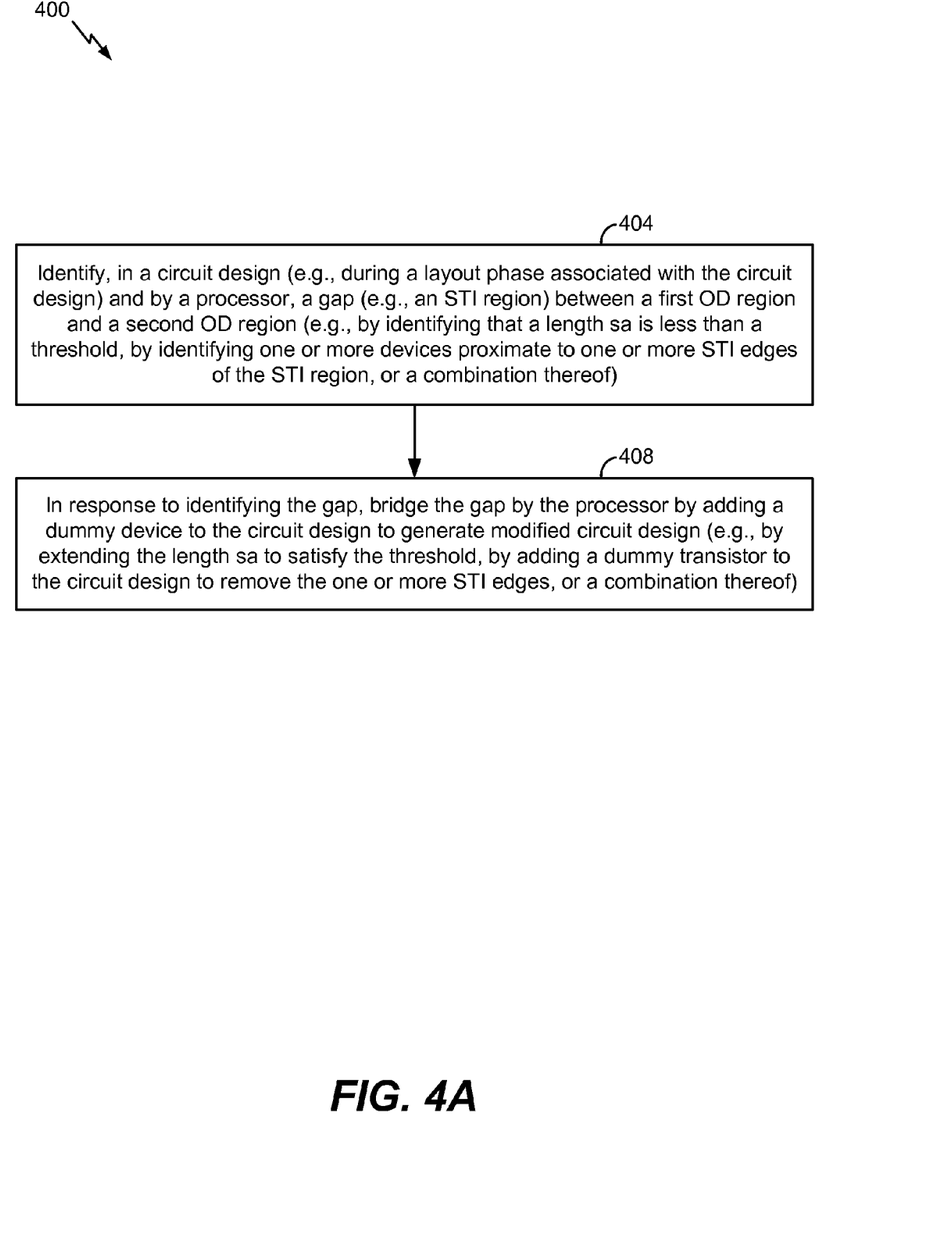
FIG. 4A is a flowchart that depicts a particular illustrative embodiment of a method of designing a circuit, such as the pulsed-latched circuit of FIG. 3.

Referring to FIG. 4A, a particular illustrative embodiment of a method is depicted and generally designated 400. The method 400 includes identifying, in a circuit design and by a processor, a gap between a first oxide on-diffusion (OD) region and a second OD region, at 404. The circuit design may correspond to the circuit design 108 of FIG. 1, the circuit design 200 of FIG. 2, or a combination thereof. The processor may correspond to the processor 116 of FIG. 1.

In a particular illustrative embodiment, the gap is identified during a layout phase associated with the circuit design. The gap may correspond to the gap 144 of FIG. 1, the STI region 206 of FIG. 2, the gap 244 of FIG. 2, or a combination thereof. In a particular illustrative embodiment, identifying the gap includes identifying one or more devices proximate to an STI edge of the STI region. For example, because the pSi regions 216, 220, 224 of FIG. 2 are proximate to the edges 210, 236, 240, respectively, the processor may determine that a gap (e.g., the gap 144, the STI region 206, or the gap 244) is adjacent to first, second, and third devices that include the pSi regions 216, 220, 224, respectively (e.g., first, second, and third transistors). In a particular illustrative embodiment, the processor identifies the gap by determining that a length sa (e.g., one or more of the lengths $sa_0$, $sa_1$, and $sa_2$) is less than a threshold (e.g., is equal to a minimum length associated with a fabrication process). Alternatively or in addition, the processor may identify the gap by identifying two devices that are each proximate to a respective edge, such as by identifying devices (e.g., transistors) including the pSi regions 220, 224 that are adjacent to the OD edges 236, 240, respectively, as described with reference to FIG. 2.

In response to identifying the gap, the method 400 further includes bridging the gap by the processor by adding a dummy device to the circuit design to generate a modified circuit design, at 408. The modified circuit may correspond to the modified circuit design 154 of FIG. 1, the modified circuit design 250 of FIG. 2, or a combination thereof. In a particular embodiment, the processor bridges the gap by increasing the length sa to satisfy the threshold, by adding a dummy device to the circuit design to remove the STI edge, or a combination thereof. For example, the processor may extend the length $sa_0$ as described with reference to FIG. 2. Alternatively or in addition, the processor may add the dummy device 248 to remove the edges 236, 240 of FIG. 2 (e.g., to extend the lengths $sa_1$ and $sa_2$). The dummy device may correspond to a dummy transistor, such as a dummy transistor configured as a decoupling capacitor. For example, the dummy transistor may be gated open (e.g., source-drain shorted) and coupled to a power terminal or to a ground terminal, causing the dummy transistor to function as a decoupling capacitor by shunting or "decoupling" particular frequencies of a signal to ground.

The method 400 may further include fabricating an integrated circuit in accordance with the modified circuit design (not shown in FIG. 4A). For example, the integrated circuit may include the pulsed-latch circuit 300 of FIG. 3. Fabrication of integrated circuits is described further with reference to FIG. 6.

By generating modified circuit designs in accordance with the method 400 of FIG. 4A, power consumption and performance of the integrated circuit can be improved. For example, the threshold to which a length sa is extended may be selected based on the particular application (e.g., based on circuit parameters, such as sensitivity to process variations associated with a fabrication process used for the particular application). Further, the method 400 may enable automated processing of circuit design data by analyzing circuit parameters to "automatically" identify gaps between OD regions and by automatically bridging such gaps to generate modified circuit designs.

Figure 4B:
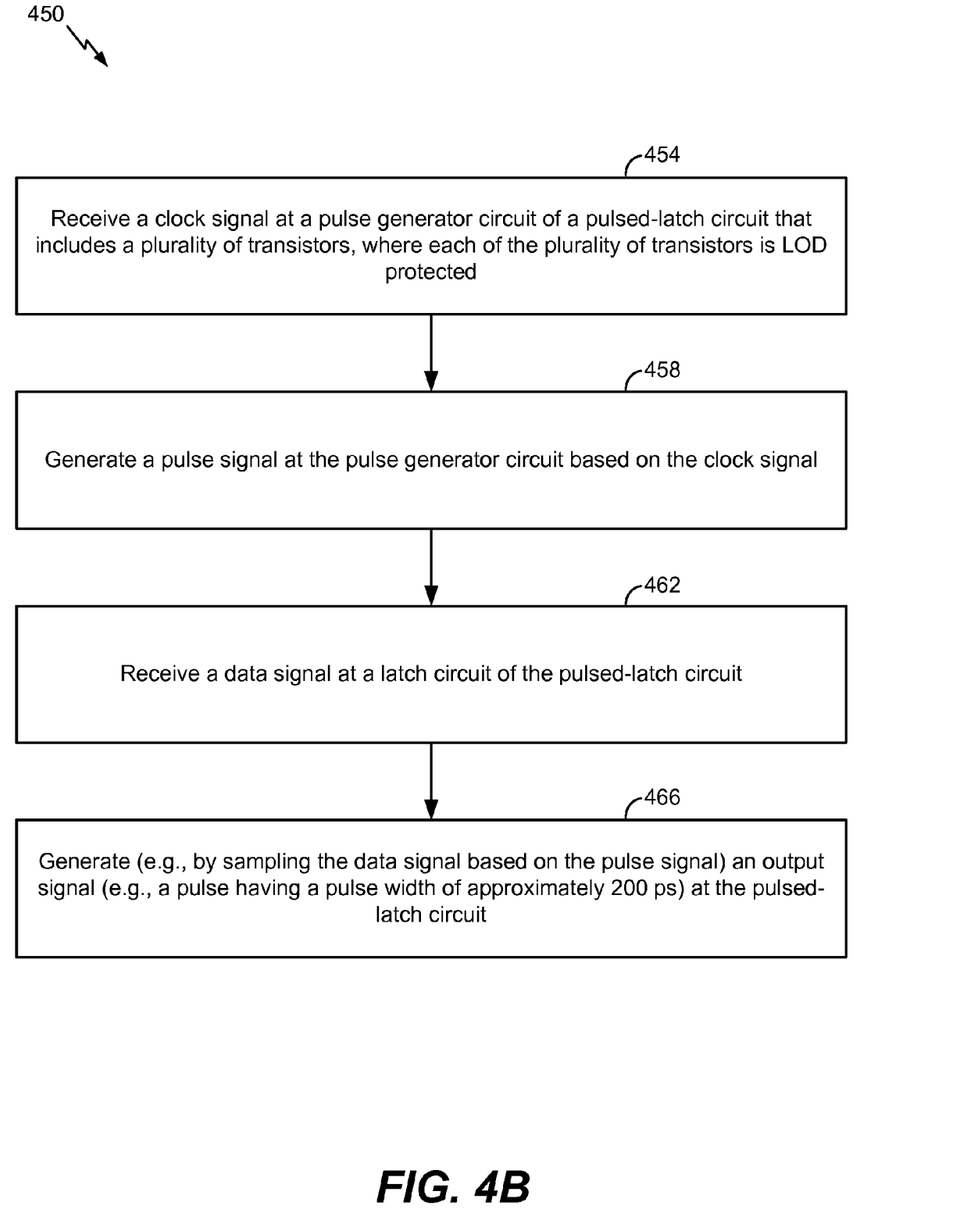
FIG. 4B is a flowchart that depicts a particular illustrative embodiment of a method of operating the pulsed-latched circuit of FIG. 3.

Referring to FIG. 4B, a flowchart that depicts a particular illustrative embodiment of a method of operating the pulsed-latched circuit of FIG. 3 is depicted and generally designated 450. At 454, the clock signal 348 is received at the pulse generator circuit 304 of the pulsed-latch circuit 300. The pulsed-latch circuit 300 includes a plurality of transistors (e.g., the LOD protected transistors 316, 320, 336, 340), where each of the plurality of transistors is LOD protected. At 458, the pulse signal 352 is generated at the pulse generator circuit 304 based on the clock signal 348.

At 462, the data signal 356 is received at the latch circuit 308 of the pulsed-latch circuit 300. At 466, the output signal 360 is generated at the pulsed-latch circuit 300. For example, the output signal 360 may be generated by sampling the data signal 356 based on the pulse signal 352. The output signal 360 may correspond to a pulse having a pulse width of approximately 200 picoseconds (ps).

Because the output signal 360 is generated using the plurality of transistors that are LOD protected, a pulse width of the output signal 360 can be accurately determined and is less susceptible to process variations associated with a process used to fabricate the pulsed-latch circuit 300. Accordingly, by controlling the pulse width to correspond more precisely to a design specification associated with the pulsed-latch circuit 300, performance of the pulsed-latch circuit 300 can be improved.

Figure 5:
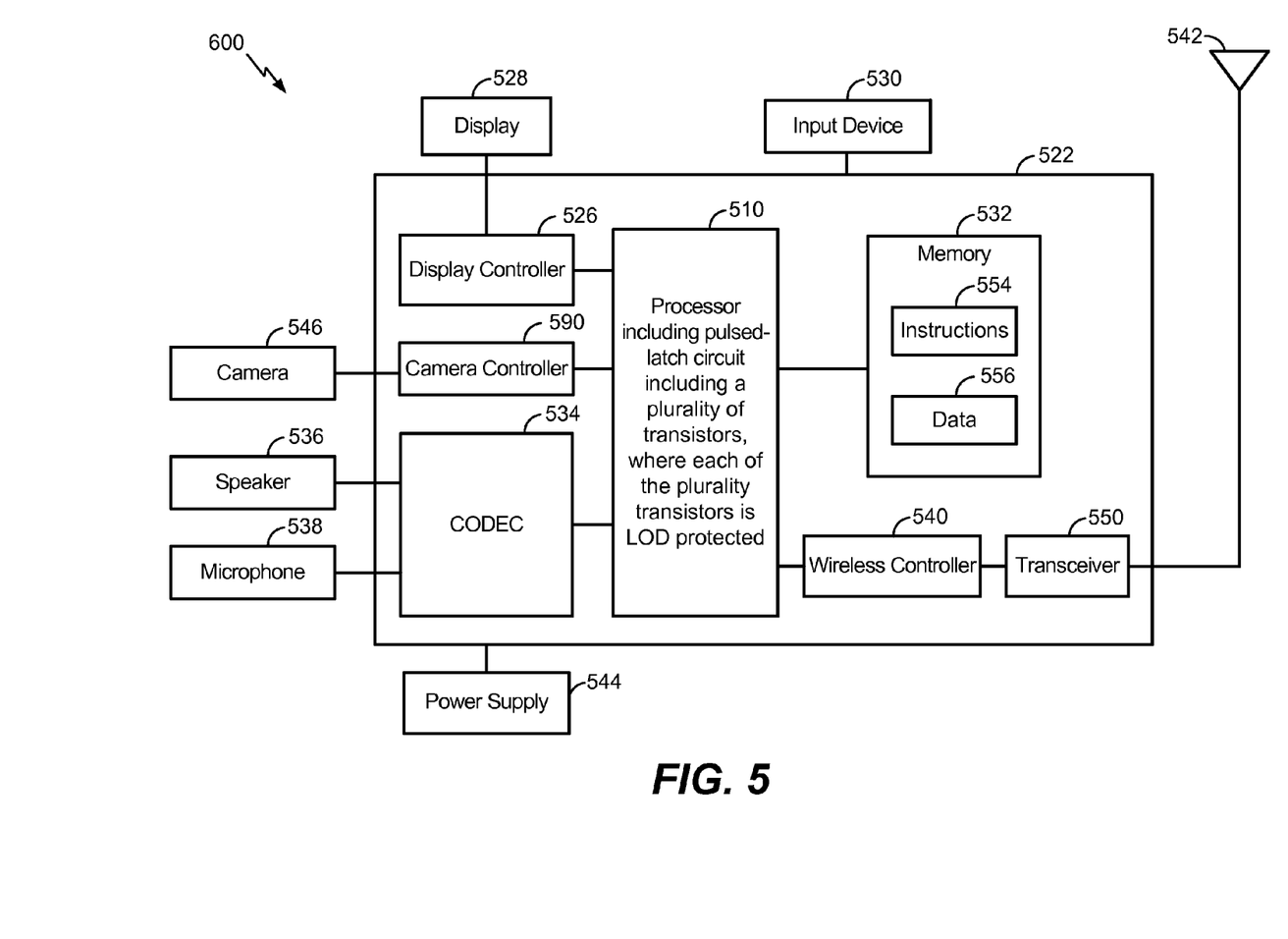
FIG. 5 is a block diagram of a particular illustrative embodiment of a mobile device that includes the pulsed-latch circuit of FIG. 3.

Referring to FIG. 5, a block diagram of a particular illustrative embodiment of a mobile device is depicted and generally designated 500. The mobile device 500 includes a processor 510. The processor 510 may be coupled to a computer-readable storage medium, such as a memory 532 (e.g., a non-transitory computer-readable medium). The memory 532 may store instructions 554 that are executable by the processor 510, data 556 that is accessible to the processor, or a combination thereof.

In FIG. 5, the processor includes a pulsed-latch circuit (e.g., the pulsed-latch circuit 300 of FIG. 3). The pulsed-latch circuit includes a plurality of transistors, where each of the plurality of transistors is length-of-diffusion (LOD) protected. The plurality of transistors may include the LOD protected transistors 316, 320, 336, 340 of FIG. 3. In a particular embodiment, the output signal is a pulse having a pulse width of approximately 200 picoseconds (ps).

FIG. 5 also shows a display controller 526 that is coupled to the processor 510 and to a display 528. A coder/decoder (CODEC) 534 can also be coupled to the processor 510. A speaker 536 and a microphone 538 can be coupled to the CODEC 534. FIG. 5 also indicates that a wireless controller 540 can be coupled to the processor 510. The wireless controller may be further coupled to an antenna 542 via a transceiver 550. A camera 546 may be coupled to a camera controller 590. The camera controller 590 may be coupled to the processor 510.

In a particular embodiment, the processor 510, the memory 532, the display controller 526, the camera controller 590, the CODEC 534, the wireless controller 540, and the transceiver 550 are included in an integrated circuit, such as a system-in-package or system-on-chip device 522. An input device 530 and a power supply 544 may be coupled to the system-on-chip device 522.

Moreover, in a particular embodiment, and as illustrated in FIG. 5, the display 528, the input device 530, the camera 546, the speaker 536, the microphone 538, the antenna 542, and the power supply 544 are external to the system-on-chip device 522. However, each of the display 528, the input device 530, the camera 546, the speaker 536, the microphone 538, the antenna 542, and the power supply 544 can be coupled to a component of the system-on-chip device 522, such as to an interface or to a controller.

Because the pulsed-latch circuit includes transistors that are LOD protected, a pulse width of the output signal can be accurately determined and is less susceptible to process variations associated with a process used to fabricate the circuit. Accordingly, by controlling the pulse width to correspond more precisely to a design specification associated with the system-on-chip device 522, power consumption and performance of the system-on-chip device 522 can be improved (e.g., by conserving an amount of current drawn from the power supply 544).

Those of skill in the art will appreciate that the foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are separated into semiconductor dies and packaged into semiconductor chips. The semiconductor chips are then employed in devices (e.g., the mobile device 500) as explained further with reference to FIG. 6.

Figure 6:
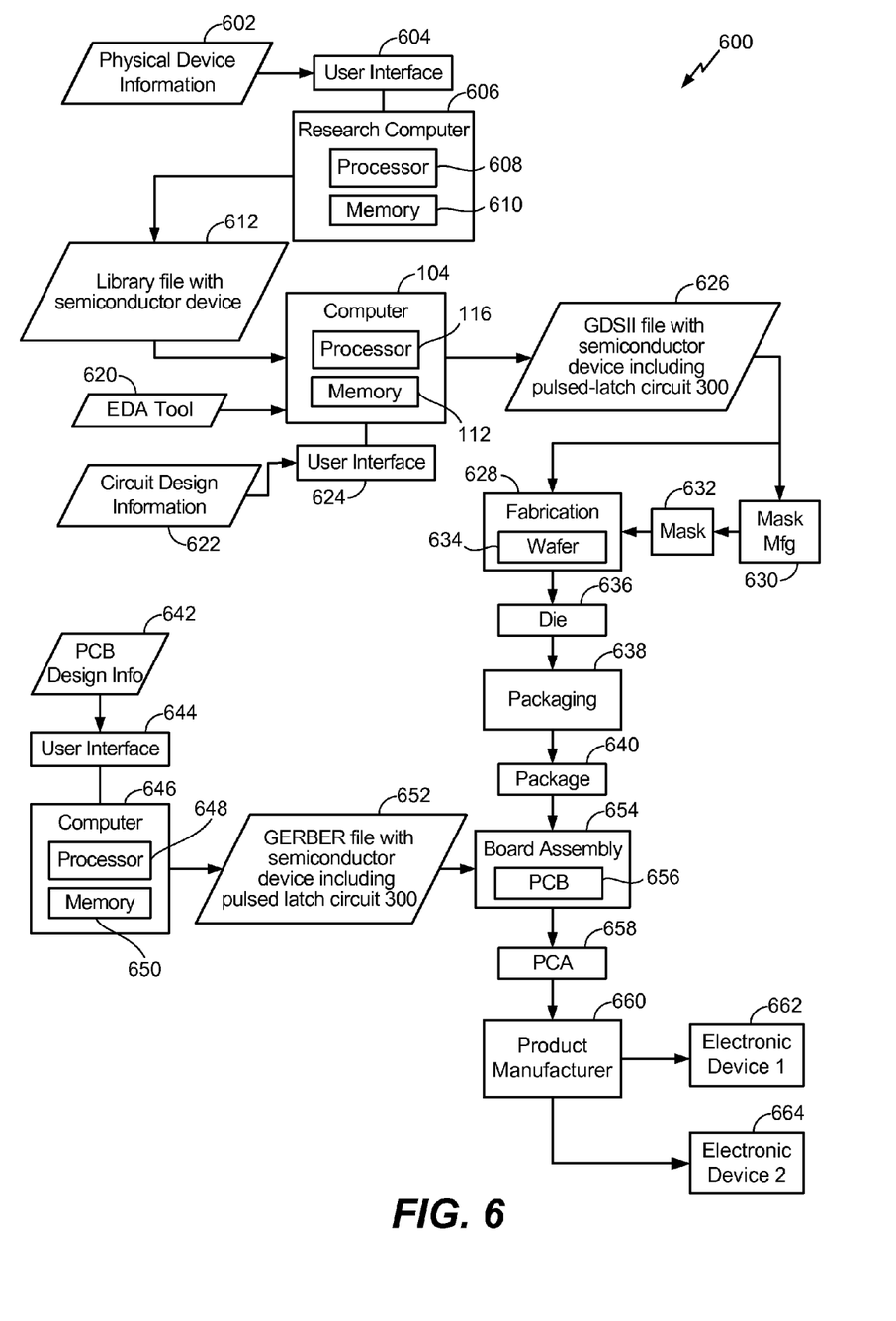
FIG. 6 is a data flow diagram of a particular illustrative embodiment of a manufacturing process to manufacture electronic devices that include the pulsed-latched circuit of FIG. 3.

Referring to FIG. 6, physical device information 602 is received at a manufacturing process 600, such as at a research computer 606. The physical device information 602 may include design information representing at least one physical property of a semiconductor device. For example, the physical device information 602 may include physical parameters, material characteristics, and structure information that is entered via a user interface 604 coupled to the research computer 606. The physical device information 602 may include physical device information corresponding to physical structures described herein. The research computer 606 includes a processor 608, such as one or more processing cores, coupled to a computer readable medium, such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices provided to use with an electronic design automation (EDA) tool 620.

The library file 612 may be used in conjunction with the EDA tool 620 at a design computer (e.g., the computer 104 of FIG. 1) including a processor (e.g., the processor 116), such as one or more processing cores, coupled to a memory (e.g., the memory 112). The EDA tool 620 may be stored as processor executable instructions at the memory 112 to enable a user of the computer 104 to design a circuit using the library file 612. For example, a user of the computer 104 may enter circuit design information 622 via a user interface 624 coupled to the computer 104. The circuit design information 622 may indicate physical properties of a semiconductor device and may correspond to the circuit design 108 of FIG. 1, the circuit design 200 of FIG. 2, or a combination thereof. The physical properties may indicate structures and relationships thereof of one or both of the circuit designs 108, 200, such as layout information (e.g., relations of oxide-on-diffusion (OD) regions, shallow trench isolation (STI) regions, field oxide regions, or a combination thereof), positioning information, feature size information, interconnection information, or other information representing physical properties of a semiconductor device. The computer 104 may analyze the physical properties (e.g., by executing the instructions 120 of FIG. 1) to generate the modified circuit design 108 of FIG. 1, the modified circuit design 250 of FIG. 2, or a combination thereof. For example, the computer 104 may analyze the layout information, the positioning information, the feature size information, the interconnection information, other information representing physical properties of a semiconductor device, or a combination thereof, to identify one or more gaps between OD regions and to bridge the one or more gaps to generate the modified circuit design 108, the modified circuit design 250, or a combination thereof, as described above.

The computer 104 may be configured to transform the circuit design information 622, including the modified circuit design 108, the modified circuit design 250, or a combination thereof, to comply with a file format. To illustrate, the file format may include a database binary file format representing planar geometric shapes, text labels, and other information about a circuit layout in a hierarchical format, such as a Graphic Data System (GDSII) file format. The computer 104 may be configured to generate a data file including the transformed design information, such as a GDSII file 626 that includes information describing the pulsed-latched circuit 300 of FIG. 3, the system-on-chip device 522 of FIG. 5, or any combination thereof, in addition to other circuits or information. To illustrate, the data file may include information corresponding to an integrated circuit that includes the pulsed-latched circuit 300 of FIG. 3, the system-on-chip device 522 of FIG. 5, and that also includes additional electronic circuits and components within the integrated circuit.

The GDSII file 626 may be received at a fabrication process 628 to manufacture the pulsed-latched circuit 300 of FIG. 3, the system-on-chip device 522 of FIG. 5, or any combination thereof, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 634, which may be tested and separated into dies, such as a representative die 636. The die 636 includes a circuit that includes the pulsed-latched circuit 300 of FIG. 3, the system-on-chip device 522 of FIG. 5, or any combination thereof.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board. The packaged semiconductor device corresponds to the package 640 and includes the pulsed-latched circuit 300 of FIG. 3, the system-on-chip device 522 of FIG. 5, or any combination thereof.

The computer 646 may be configured to transform the PCB design information 642 to generate a data file, such as a GERBER file 652, with data that includes physical positioning information of a packaged semiconductor device on a circuit board, as well as layout of electrical connections such as traces and vias, where the packaged semiconductor device corresponds to the package 640 including the pulsed-latched circuit 300 of FIG. 3, the system-on-chip device 522 of FIG. 5, or any combination thereof. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a set top box, a music player, a video player, an entertainment unit, a navigation device, a communications device, a personal digital assistant (PDA), a fixed location data unit, and a computer, into which the pulsed-latched circuit 300 of FIG. 3, the system-on-chip device 522 of FIG. 5 is integrated. As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. In a particular embodiment, the electronic devices 662 and 664 correspond to the mobile device 500 of FIG. 5.

Accordingly, a device that includes the pulsed-latched circuit 300 of FIG. 3, the system-on-chip device 522 of FIG. 5, or any combination thereof, may be fabricated, processed, and incorporated into an electronic device, as described in the illustrative process 600. One or more aspects of the embodiments disclosed with respect to FIGS. 1-5 may be included at various processing stages, such as within the library file 612, the GDSII file 626, and the GERBER file 652, as well as stored at the memory 610 of the research computer 606, the memory 112 of the computer 104, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity or by one or more entities performing various stages of the process 600.

In a particular embodiment, a computer-readable storage medium (e.g., the memory 112 of FIG. 1) stores instructions (e.g., the instructions 120) executable by a processor (e.g., the processor 116) to perform operations including identifying, in a circuit design (e.g., the circuit design 108, the circuit design 200, or a combination thereof) and by the processor, a gap (e.g., the gap 144, the gap 244, or a combination thereof) between a first oxide-on-diffusion (OD) region (e.g., one of the OD regions 124, 128, 208, 212) and a second OD region (e.g., another of the OD regions 124, 128, 208, 212). The operations further include bridging the gap, in response to identifying the gap and by the processor, by adding a dummy device (e.g., any of the dummy devices 162, 248, 312, 324, 332, 344, or a combination thereof) to the circuit design to generate a modified circuit design (e.g., the modified circuit design 154, the modified circuit design 250, or a combination thereof).

In a particular embodiment, an apparatus includes means for generating (e.g., the pulse generator circuit 304) a pulse signal (e.g., the pulse signal 352) responsive to a clock signal (e.g., the clock signal 348). The apparatus further includes means for generating (e.g., the latch circuit 308) an output signal (e.g., the output signal 360) responsive to the pulse signal. The means for generating the output signal includes multiple transistors (e.g., the LOD protected transistors 336, 340) that are each length-of-diffusion (LOD) protected.

As used herein, "oxide-on-diffusion" may refer to a diffusion region of a substrate and any transistor gate oxide regions adjacent to the diffusion region. For example, "oxide-on-diffusion" may refer to doped regions of a substrate that form drain, source, and bulk regions of one or more transistors in addition to any transistor gate oxide regions adjacent to (e.g., in contact with) with the doped regions. As used herein, "LOD protected" may indicate a transistor having a length sa (as described with reference to FIG. 2) that is greater than a threshold length, such as a minimum length associated with (e.g., defined by) a fabrication technology used to fabricate the transistor.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit comprising:
a pulsed-latch circuit including a first plurality of transistors, wherein one or more of the first plurality of transistors is length-of-diffusion (LOD) protected, and wherein the pulsed-latch circuit further comprises:
a pulse generator circuit responsive to a clock signal, wherein the pulse generator circuit is configured to generate a pulse in response to the clock signal; and
a latch circuit configured to sample data in response to the generated pulse,
wherein the pulse generator circuit includes a delay path that includes the first plurality of transistors.

2. The circuit of claim 1, wherein the latch circuit includes a second plurality of transistors that are each LOD protected.

3. A circuit comprising:
a pulsed-latch circuit including a first plurality of transistors, wherein one or more of the first plurality of transistors is length-of-diffusion (LOD) protected, wherein the pulsed-latch circuit further includes a shallow trench isolation (STI) region having an STI edge, wherein at least a first transistor of the first plurality of transistors includes a poly-silicon (pSi) region, and wherein a length between an edge of the pSi region and the STI edge is greater than a threshold length associated with a fabrication technology used to fabricate the first transistor.

4. A circuit comprising:
a pulsed-latch circuit including a first plurality of transistors, wherein one or more of the first plurality of transistors is length-of-diffusion (LOD) protected, and wherein each of the transistors is non-adjacent to a shallow trench isolation (STI) edge of an STI region of the pulsed-latch circuit.

5. A method comprising:
identifying, in a circuit design and by a processor, a gap between a first oxide-on-diffusion (OD) region and a second OD region; and
in response to identifying the gap, bridging the gap by the processor by adding a dummy device to the circuit design to generate a modified circuit design, wherein the dummy device is bridged across the gap.

6. The method of claim 5, wherein the dummy device corresponds to a dummy transistor.

7. The method of claim 6, wherein the dummy transistor is configured as a decoupling capacitor.

8. The method of claim 5, wherein the gap corresponds to a shallow trench isolation (STI) region of the circuit design.

9. The method of claim 5, wherein identifying the gap includes identifying a second device proximate to a first shallow trench isolation (STI) edge of an STI region in the circuit design, and wherein adding the dummy device removes the first STI edge from the circuit design by bridging the gap between the first OD region and the second OD region.

10. The method of claim 9, further comprising identifying a third device proximate to a second STI edge of the STI region, wherein adding the dummy device removes the second STI edge from the circuit design by bridging the gap between the first OD region and the second OD region.

11. The method of claim 10, wherein identifying the gap and bridging the gap are performed by the processor executing instructions retrieved from a memory, and wherein identifying the gap and bridging the gap are performed by the processor during a layout phase of the circuit design.

12. The method of claim 5, wherein the modified circuit design corresponds to a pulsed-latch circuit that includes multiple transistors each non-adjacent to a shallow trench isolation (STI) edge.

13. The method of claim 6, further comprising fabricating a circuit in accordance with the modified circuit design.

14. A method comprising:
    receiving a clock signal;
    generating a pulse signal based on the clock signal at a pulse generator, wherein the pulse generator includes a delay path circuit that includes a plurality of transistors, and wherein each of the plurality of transistors is length-of-diffusion (LOD) protected;
    receiving a data signal; and
    generating an output signal by sampling the data signal based on the pulse signal.

15. The method of claim 14, wherein the output signal has a pulse width of approximately 200 picoseconds (ps).

16. A non-transitory computer-readable medium storing instructions that are executable by a processor to perform operations comprising:
    identifying, in a circuit design and by the processor, a gap between a first oxide-on-diffusion (OD) region and a second OD region; and
    in response to identifying the gap, bridging the gap by the processor by adding a dummy device to the circuit design to generate a modified circuit design, wherein the dummy device is bridged across the gap.

17. The computer-readable storage medium of claim 16, wherein identifying the gap and bridging the gap are performed during a layout phase associated with the circuit design.

18. An apparatus comprising:
    means for generating a pulse signal responsive to a clock signal; and
    means for generating an output signal responsive to the pulse signal,
    wherein the means for generating the output signal includes multiple transistors that are each length-of-diffusion (LOD) protected, and
    wherein the means for generating the pulse signal includes a second plurality of transistors that are each LOD protected.

19. The apparatus of claim 18, wherein the means for generating the pulse signal includes a pulse generator circuit.

20. The apparatus of claim 18, wherein the means for generating the output signal is further responsive to a data signal, and wherein the output signal is generated by sampling the data signal at times determined by the pulse signal.

21. The apparatus of claim 18, further comprising an integrated circuit that includes the means for generating the pulse signal and the means for generating the output signal.

* * * * *